(12) United States Patent  (10) Patent No.: US 8,053,813 B2
Morishige  (45) Date of Patent: Nov. 8, 2011

(54) SEMICONDUCTOR DEVICE AND LAYOUT METHOD THEREOF

(75) Inventor: Kazuyuki Morishige, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 239 days.

(21) Appl. No.: 12/320,785

(22) Filed: Feb. 4, 2009

(65) Prior Publication Data

US 2009/0200579 A1  Aug. 13, 2009

(30) Foreign Application Priority Data

Feb. 7, 2008 (JP) .................... 2008-028211

(51) Int. Cl.
*H01L 27/118* (2006.01)

(52) U.S. Cl. .. 257/210; 257/208; 257/296; 257/E29.166

(58) Field of Classification Search .................. 257/210, 257/208, E29.166
See application file for complete search history.

(56) References Cited

U.S. PATENT DOCUMENTS

| | | | |
|---|---|---|---|
| 6,680,501 B2 * | 1/2004 | Ito et al. ........................ | 257/296 |
| 7,109,585 B2 | 9/2006 | Kang et al. | |
| 2006/0011993 A1 | 1/2006 | Kang et al. | |

FOREIGN PATENT DOCUMENTS

| | | |
|---|---|---|
| JP | 10-125775 | 5/1998 |
| JP | 2006-32944 | 2/2006 |

* cited by examiner

*Primary Examiner* — Tan N Tran
(74) *Attorney, Agent, or Firm* — McGinn IP Law Group, PLLC

(57) ABSTRACT

A semiconductor device includes first lines extending in a first direction and formed in a first wiring layer in a predetermined arrangement order, second lines formed in a second wiring layer different from the first wring layer in the predetermined arrangement order, and contacts electrically connecting between the first lines and the second lines so as to match the arrangement order. In the semiconductor device, at least adjacent two tracks are defined in a linear manner parallel to a second direction perpendicular to the first direction. Then, each of the second lines includes a first line portion extending along one of the two tracks, a second line portion extending along another of the two tracks, and a connection portion connecting between the first and second line portions, while two or more of the contacts are formed at the connection portion.

9 Claims, 8 Drawing Sheets

LINE (FIRST WIRING LAYER)

LINE (SECOND WIRING LAYER)

LINE (THIRD WIRING LAYER)

LINE (FIRST WIRING LAYER)

LINE (SECOND WIRING LAYER)

LINE (THIRD WIRING LAYER)

— LINE (FIRST WIRING LAYER)

| | |
|---|---|
|  | LINE (FIRST WIRING LAYER) |
|  | LINE (SECOND WIRING LAYER) |
|  | LINE (THIRD WIRING LAYER) |

LINE (FIRST WIRING LAYER)

LINE (SECOND WIRING LAYER)

SEMICONDUCTOR DEVICE AND LAYOUT METHOD THEREOF

BACKGROUND OF THE INVENTION

1. Field of the Invention

The present invention relates to a semiconductor device in which a layout pattern is formed in a plurality of wiring layers, and particularly relates to a semiconductor device capable of laying out a large number of signal lines effectively, and a layout method thereof.

2. Description of Related Art

A semiconductor memory device such as a DRAM (Dynamic Random Memory) is configured to selectively access an arbitrary memory cell for an array portion including a large number of memory cells. The arbitrary memory cell in the array portion is corresponded to a word line and a bit line which are arranged in a matrix shape and is selected based on a unique address. A large number of decoders for selecting a memory cell corresponding to a designated address are attached to the array portion. Since such decoders are arranged with a pitch corresponding to memory cells, a line group connected to the decoders needs to be densely arranged with the same pitch as the memory cells.

Generally, word lines and bit lines are arranged perpendicular to each other. Therefore, when wiring line groups between peripheral circuits and the decoders, there are sections through which a line group in a word line extending direction and a line group in a bit line extending direction are to be connected. In this case, since the line group in the word line extending direction and the line group in the bit line extending direction are formed in different wiring layers, contacts for connecting upper and lower wiring layers are required to be formed. A structure having the line groups formed in a matrix shape in the different wiring layers and the contacts connecting the upper and lower wiring layers is disclosed, for example, in Patent References 1 and 2.

Patent Reference 1: Laid-open Japanese Patent Publication No. 2006-032944

Patent Reference 2: Laid-open Japanese Patent Publication No. Hei 10-125775

FIG. 7 shows a layout example in which two line groups formed in a matrix shape in two wiring layers are connected through contacts. As shown in the bottom part of FIG. 7, for convenience, a lateral direction is defined as an X direction and a longitudinal direction is defined as a Y direction. A plurality of lines 101 extending in the Y direction arranged in parallel with a constant pitch are formed in a first wiring layer. A plurality of lines 102 extending in the X direction arranged in parallel with a constant pitch are formed in a second wiring layer over the first wiring layer. There are formed contacts 103, each one of which is formed at an intersection between each line 101 of the first wiring layer and each line 102 of the second wiring layer. Line groups capable of bi-directionally transmitting six groups of signals in X and Y directions through six contacts 103 can be formed in FIG. 7 as a whole. If layouts of the same structure are repeatedly arranged, line groups capable of transmitting a larger number of signals can be formed.

However, in the layout of FIG. 7, there is a possibility that poor connection of the contacts 103 occurs due to trouble in the intersection of each line 101 and each line 102. In this case, sine line groups having a vast number of lines are arranged in the entire array portion, there is a problem from a viewpoint of reliability that a single poor connection of the contacts 103 directly causes a defect in an entire chip. As measures against such a problem, FIG. 8 shows a layout example achieving the same function as that of FIG. 7 by using a different layout. As different from FIG. 7, there are formed two contacts 104 arranged in the Y direction at each intersection between each of a plurality of lines 101 formed in the first wiring layer and each of a plurality of lines 102 formed in the second wiring layer. Thereby, if there is a poor connection at one of the two contacts 104 at the intersection, an electrical connection between the lines 101 and 102 can be maintained when the other contact 104 is in a normal state. Thus, the layout of FIG. 8 is capable of reducing the possibility of the poor connection in comparison with the layout of FIG. 7 so as to improve reliability of the chip.

However, when employing the layout of FIG. 8, a gap between the lines 102 extending in the X direction increases corresponding to the two contacts 104 arranged in the Y direction. That is, when comparing a pitch P1 of the lines 102 in the layout of FIG. 7 and a pitch P2 of the lines 102 in the layout of FIG. 8, a relation P2>P1 is satisfied, and therefore it becomes a problem that extra space is required corresponding to an increase in pitch in case of arranging the same number of the lines 102.

SUMMARY

The present invention seeks to solve the above problems and provides a semiconductor device having a layout with excellent space efficiency in which line groups perpendicular to each other in different wiring layers are connected to each other without a decrease in reliability due to poor connection, and also provides a layout method thereof.

In one of aspects of the invention, there is provided a semiconductor device comprising a plurality of first lines extending in a first direction and formed in a first wiring layer in a predetermined arrangement order, a plurality of second lines formed in a second wiring layer different from the first wring layer in the predetermined arrangement order, and a plurality of contacts electrically connecting between the first lines and the second lines so as to match the arrangement order. In the semiconductor device of the present invention, at least adjacent two tracks are defined in a linear manner in parallel to a second direction perpendicular to the first direction, each of the second lines includes a first line portion extending along one of the two tracks, a second line portion extending along another of the two tracks, and a connection portion connecting between the first and second line portions, and two or more of the plurality of contacts are formed at the connection portion.

According to the aspects of the invention, each of the first lines formed in the first wiring layer extends in the first direction, and each of the second lines formed in the second wiring layer extends in the second direction and has the connection portion halfway which is shifted by one track in the second direction. Then, two or more contacts are formed at the connection portion of the second line, and the first and second lines whose arrangement order is matched are connected in a stacking direction. Thus, a signal group having a predetermined arrangement order can be reliably transmitted through line groups formed in different layers, and each transmission path can be connected through two or more contacts so as to improve connection reliability. Further, the plurality of second lines in the second wiring layer can be arranged with an increasing space corresponding to one track, a layout having excellent space efficiency can be achieved.

As described above, according to the present invention, when line groups in a matrix shape in first and second wiring layers are connected to each other, each second line in the second wiring layer is formed so as to be shifted by one track at the connection portion, and two or more contacts are formed at the connection portion, thereby forming the layout of the semiconductor device. Thus, in a state in which both line groups having the same arrangement order are arranged, the both line groups are bent in different directions and capable of being connected to each other reliably. In this case, if poor connection occurs at one of contacts formed at the connection portion, the connection of the other of contacts is maintained, thereby improving connection reliability. Further, since an increase in space in the second wiring layer corresponds to only one track due to the structure of the connection portion, space efficiency particularly for a lager number of lines can be improved. Furthermore, when a linear line group is formed in a wiring layer different from the first and second wiring layers using the same arrangement as tracks in the second wiring layer, cross talk noise due to interference from signals of the second wiring layer can be reduced because the second lines are shortened.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, a DRAM as a semiconductor device to which the present invention is applied will be described as one of the embodiments.

[Basic Concept of the Present Invention]

Figure 1:
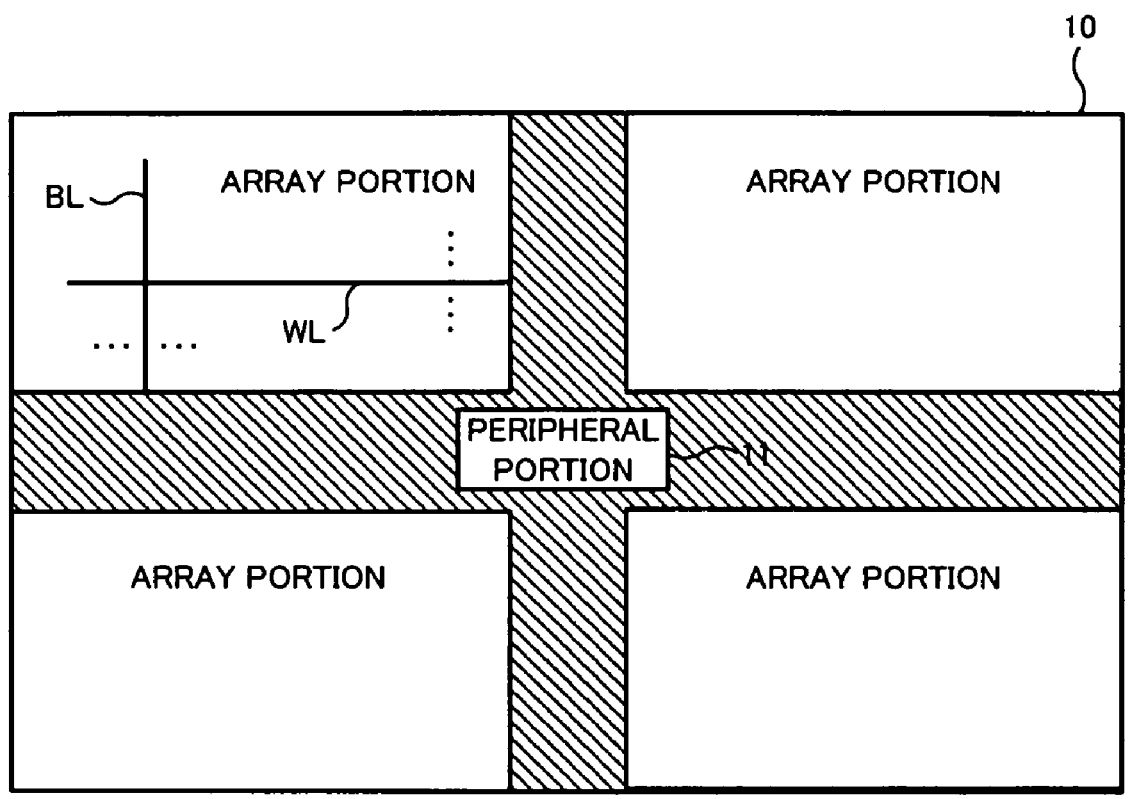
FIG. 1 is a block diagram showing an entire configuration of a DRAM of an embodiment of the present invention.
Figure 2:
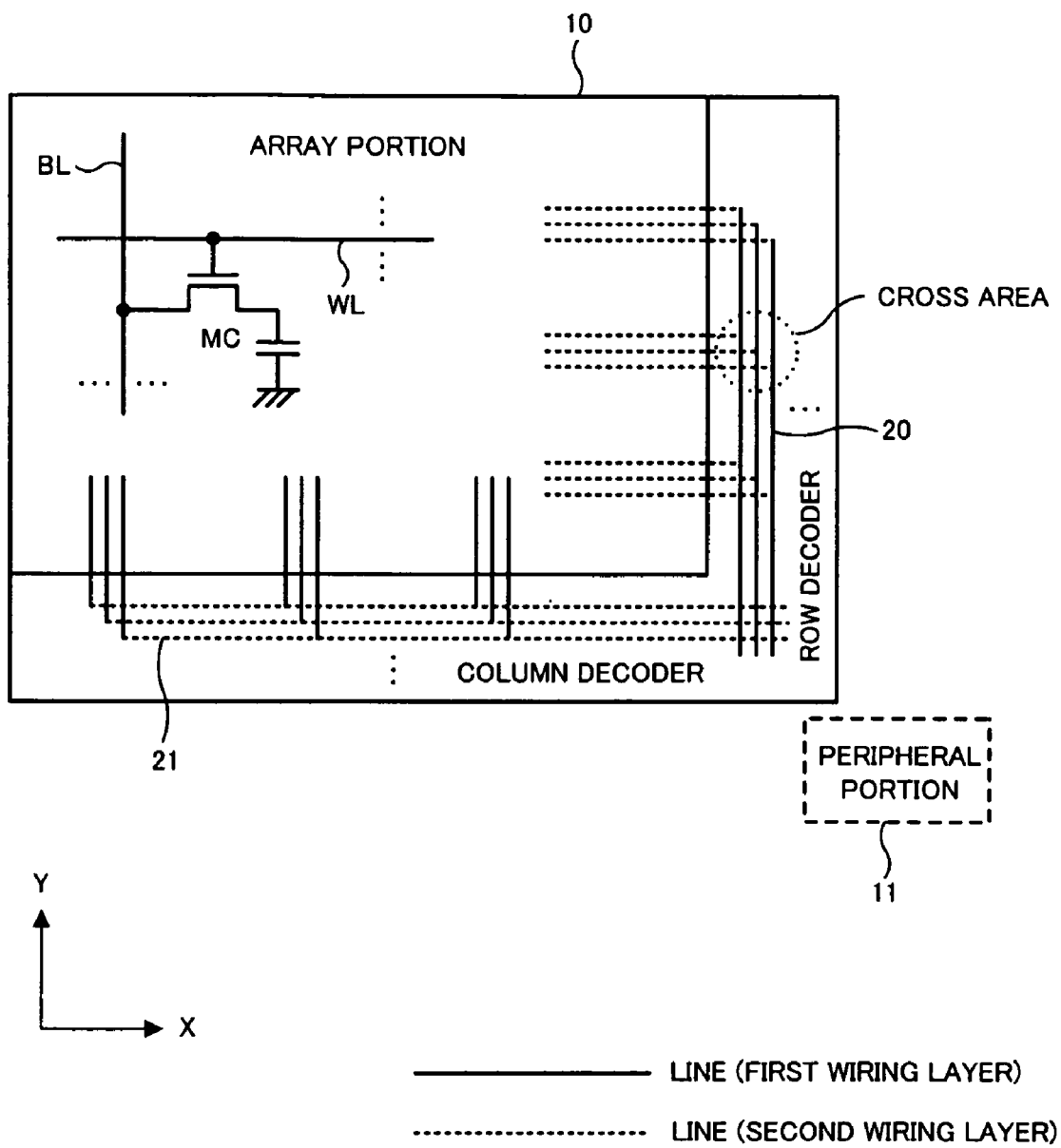
FIG. 2 is a diagram explaining line groups provided around an array portion 10 of FIG. 1.

A schematic configuration of the DRAM to which the present invention is applied will be described with reference to FIGS. 1 and 2. FIG. 1 is a block diagram showing an entire configuration of the DRAM, and FIG. 2 is a diagram explaining line groups provided around an array portion 10 of FIG. 1. The entire DRAM of the embodiment includes the array portion 10 configured to be divided into four regions (banks), and a peripheral portion 11 disposed in an area where the array portion 10 is not disposed. The array portion 10 includes a large number of memory cells MC (FIG. 2) formed at intersections of a plurality of word lines WL and a plurality of bit lines BL, and also includes circuits (not shown) for accessing each memory cell MC, such as a sense amplifier circuit, a driver circuit and a decode circuit. Meanwhile, the peripheral portion 11 includes circuits related to the operation of the array portion 10, such as a control circuit and an input/output circuit.

The large number of memory cells MC are repeatedly arranged in the array portion 10. Thus, it is necessary to provided a large number of elements and lines in other circuits so as to be adapted to a pitch of the memory cells M. On the other hand, the repeated arrangement as in the array portion 10 is not required in the peripheral portion 11, and the number of elements in the peripheral portion 11 is smaller than that in the array portion 10.

As shown in the bottom part of FIG. 2, a lateral direction is defined as an X direction and a longitudinal direction is defined as a Y direction. In the array portion 10, the word lines WL extend in the X direction and the bit lines BL extend in the Y direction, and the entire array portion 10 is formed in a matrix shape. Each memory cell MC formed at an intersection of each word line WL and each bit line BL is specified by a given unique address. In an outer area of the array portion 10, circuits and line groups related to the word lines WL are provided on an end portion in the X direction, and circuits and line groups related to the bit lines BL are provided on an end portion in the Y direction. FIG. 2 shows a row decoder corresponding to the word lines WL on the end portion in the X direction and a column decoder corresponding to the bit lines BL on the end portion in the Y direction, respectively as examples of the circuits.

In the area including the row decoder and the column decoder, line groups extending in the Y direction are formed in a first wiring layer, and line groups extending in the X direction are formed in a second wiring layer over the first wiring layer. FIG. 2 shows line groups (solid lines) in the Y direction formed in the first wiring layer and line groups (dotted lines) in the X direction formed in the second wiring layer, respectively in areas near the row decoder and the column decoder. When attention is focused on the vicinity of the row decoder of FIG. 2, areas for connecting each line group in the X direction and each line group in the Y direction (hereinafter referred to as "cross areas" shown in FIG. 2) are required. This is a necessary structure since the word lines WL and the bit lines BL are perpendicular to each other and the arrangement of the row decoder and the column decoder is restricted. In each of the above cross areas, contacts for electrically connecting the first wiring layer and the second wiring layer in a stacking direction are formed for respective lines. It is assumed that a plurality of contacts are formed at each connecting point of the lines in the embodiment, however specific description thereof will be made later.

[Layout Example of the Present Invention]

Figure 3:
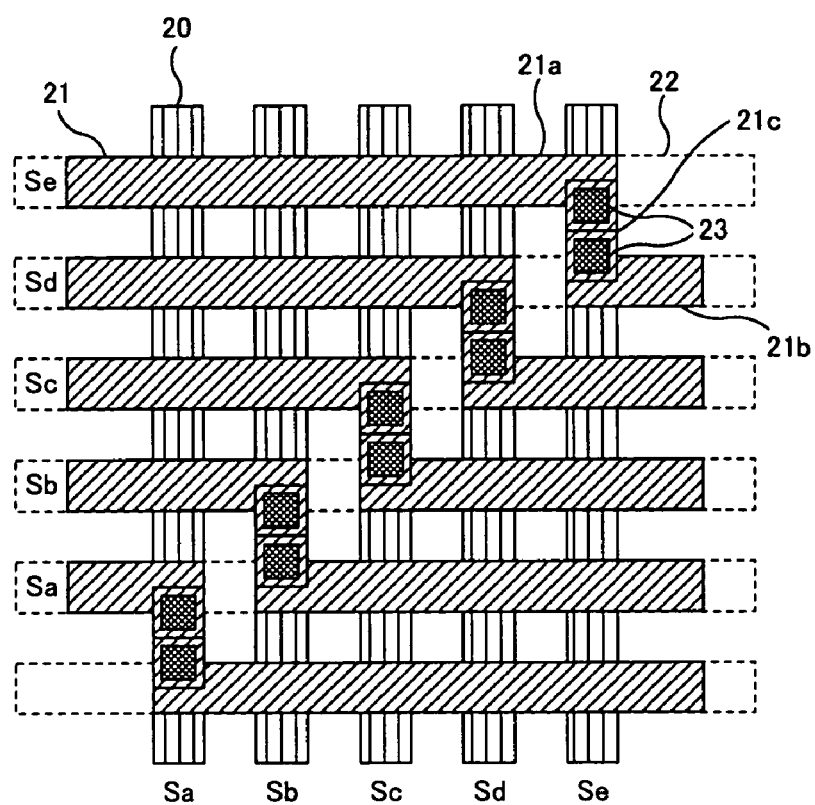
FIG. 3 is a plane view showing an example of specific layouts of the embodiment.
Figure 3:
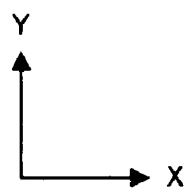
Figure 3:
Figure 3:
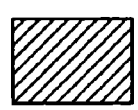
Figure 3:

FIG. 3 is a plane view showing an example of specific layouts of the embodiment. In the layout of FIG. 3, there is shown a wiring pattern formed on a lower first wiring layer and an upper second wiring layer in a matrix shape. A plurality of lines 20 extending in the Y direction are formed in the first wiring layer, and a plurality of lines 21 extending in the X direction are formed in the second wiring layer. The plurality of lines 20 of the first wiring layer form a line group arranged in parallel with a predetermined pitch, and the respective lines 20 thereof extend in the Y direction. Meanwhile, there is provided a third wiring layer over the second wiring layer, in which a plurality of lines 22 extending in the X direction are formed. The plurality of lines 22 of the third wiring layer form a line group arranged in parallel with the same pitch as the second wiring layer, and the respective lines 22 thereof extend in the X direction.

Each of the lines 21 of the second wiring layer is formed along adjacent two tracks, among a plurality of tracks defined in a linear manner parallel to the X direction with a predetermined pitch, and includes line portions 21a, 21b and a connection portion 21c. For example, by focusing attention on the line 21 located at the upper end in FIG. 3, the line portion 21a is formed along a first track (top position in FIG. 3) at the left side, and the line portion 21b is formed along a second track at the right side. Then, the connection portion 21c connects between the line portions 21a and 21b of both sides in the Y direction. As shown in FIG. 3, adjacent two contacts 23 are formed at the connection portion 21c. Immediately under the connection portion 21c, a line 20 of the corresponding order is arranged opposite to the connection portion 21c, and the connection portion 21c of the second wiring layer and the line 20 of the first wiring layer is electrically connected through the two contacts 23. A second or more line 21 in FIG. 3 is formed in the same manner with the above-mentioned structure along the adjacent two tracks.

In the example of FIG. 3, a signal group including signals Sa, Sb, Sc, Sd and Se arranged in this order is assumed to be transmitted through the plurality of lines 20 of the first wiring layer from left to right in FIG. 3. Meanwhile, a signal group including the signals Sa, Sb, Sc, Sd and Se arranged in this order is assumed to be transmitted through the plurality of lines 21 of the second wiring layer from bottom to top in FIG. 3. Thus, in order to transmit a common signal through corresponding lines 20 and 21, the arrangement order (from left to right) of the plurality of lines 20 of the first wiring layer needs to be matched to the arrangement order (from bottom to top) of the plurality of lines 21 of the second wiring layer. Therefore, positions of connection portions 21c where contacts 23 are formed are sequentially shifted in the order of the signals Sa, Sb, Sc, Sd and Se from the bottom left to the top right in FIG. 3.

In addition, the signal group may be corresponded to the plurality of lines 21 of the second wiring layer in an order reverse to that of FIG. 3. In this case, since the signals Sa, Sb, Sc, Sd and Se are arranged from the top in this order, top and bottom sides of the arrangement is assumed to be symmetric to those of FIG. 3, so that positions of connection portions 21c are to be sequentially shifted from the top left to the bottom right in FIG. 3. Further, when the signal group in the reverse order is corresponded to the plurality of lines 20 of the first wiring layer, left and right sides of the arrangement may be assumed to be symmetric to those of FIG. 3.

Figure 4:
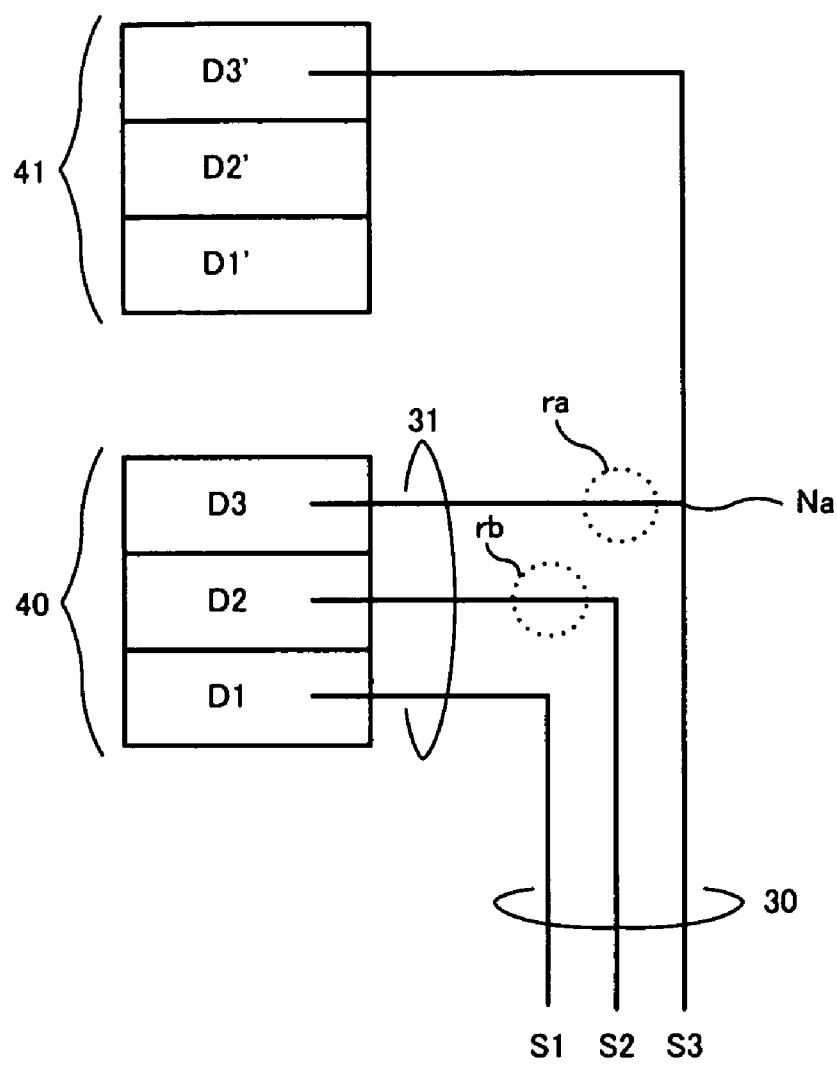
FIG. 4 is a diagram showing an example in which the line group is formed using a single layer regarding a connection relation of a cross area in the array portion 10 of FIG. 2.

Here, a reason for connecting the respective line groups using two layers of the first and second wiring layers will be described with reference to FIGS. 4 and 5. FIG. 4 shows an example in which the line group is formed using a single layer without using two layers facing to each other, regarding a connection relation of the cross area in the array portion 10 of FIG. 2. For convenience, a case will be considered where three signals S1, S2 and S3 are coupled to a line group 30 including three lines and transmitted therethrough. In the array portion 10, there are provided a decoder group 40 including three decoders D1, D2 and D3 and a decoder group 41 including three decoders D1', D2', D3', and the signals S1, S2 and S3 are required to be coupled to each of the decoder groups 40 and 41.

The line group 30 in the Y direction formed in the first wiring layer is bent halfway and connected to the decoder group 40 at the near side, as the line group 31 in the X direction formed in the first wiring layer. The signals S1, S2 and S3 are coupled to the decoders D1, D2 and D3 in this order. Meanwhile, when the line group 30 is connected to the decoder group 41 at the far side, a line through which the signal S3 is transmitted can be connected to the decoder D3' of the decoder group 41 by branching the line at a node Na. However, a line through which the signal S2 is transmitted cannot be extended beyond a wring area ra at an end of the line group 31, since the wiring area ra behaves as a barrier. Similarly, a line through which the signal S1 is transmitted cannot be extended beyond a wring area rb at a center of the line group 31, since the wiring area rb behaves as a barrier. In this manner, when only the first wiring layer is used, it is difficult to connect the line group to both of two decoder groups 40 and 41 having the same arrangement order as that of the line group.

Figure 5:
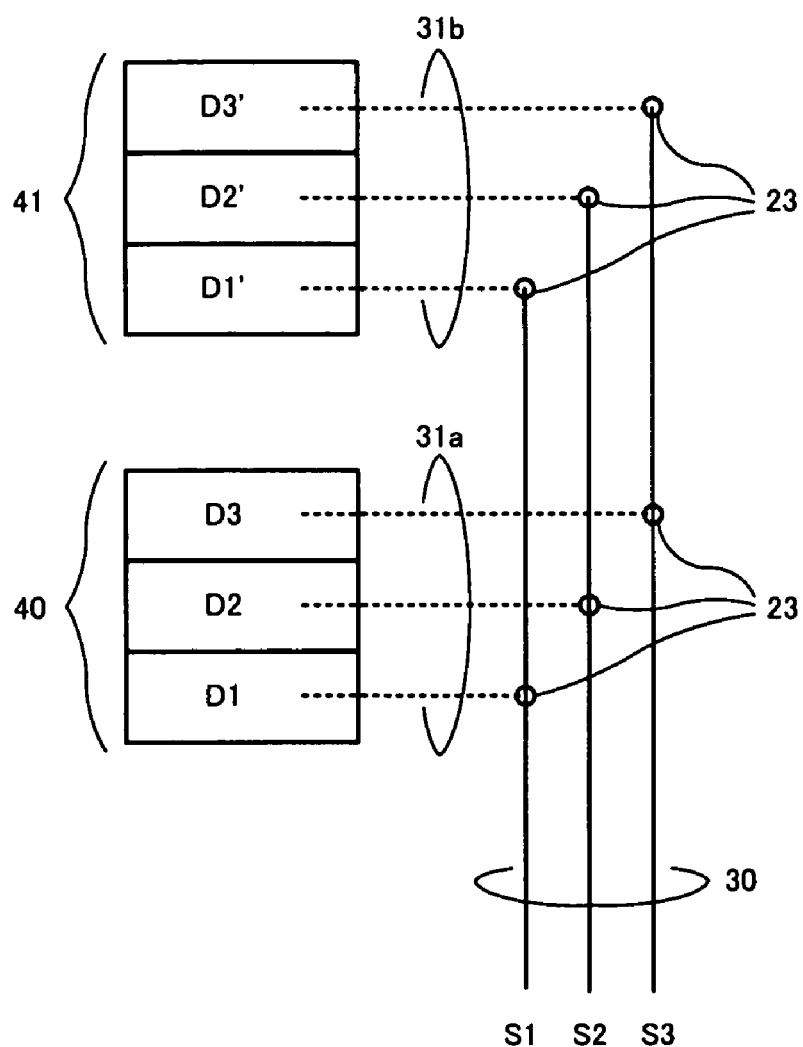
FIG. 5 is a diagram showing an example in which the line group is formed using two layers facing to each other regarding the connection relation of the cross area in the array portion 10 of FIG. 2.

On the other hand, FIG. 5 shows an example in which the line groups are formed using two layers facing to each other, regarding the above connection relation. Contacts 23 are formed halfway along the line group 30 in the Y direction formed in the first wiring layer, which is connected to a line group 31a in the X direction formed in the upper second wiring layer through the contacts 23. Thus, the signals S1, S2 and S3 are coupled to the decoders D1, D2 and D3 of the decoder group 40 at the near side in this order similarly as in FIG. 4. Meanwhile, the line group 30 is extended and connected to a line group 31b in the X direction formed in the second wiring layer with the same structure as described above by further forming contacts 23 at the far side. Thus, the signals S1, S2 and S3 are also coupled to the decoders D1', D2' and D3' of the decoder group 41 at the far side in this order. Due to this reason, when a predetermined line group is branched and connected to a plurality of circuits in the same arrangement order, at least two wiring layers need to be used.

Returning to FIG. 3, by focusing attention on the lines 22 formed in the third wiring layer over the second wiring layer, each line 22 is arranged opposite to the line 21 of the lower second wiring layer. However, each single line 21 transmitting either of the signals Sa to Se, for example, is formed so that the line portion 21a faces to a predetermined line 22 in the left side of FIG. 3 and the line portion 21b faces to a line 22 adjacent to the predetermined line 22 in the right side of FIG. 3. In other words, the lines 21 facing to the left and right sides of the predetermined line 22 are shifted by one track at a boundary where the contacts 23 are formed at the connection portion 21c. By employing the structure of FIG. 3, the length at which portions of the lines 21 and 22 face to each other can be shorter than the entire length. Thereby, it is possible to reduce cross talk noise due to interference between signals transmitted through the respective lines 21 and 22.

Figure 7:
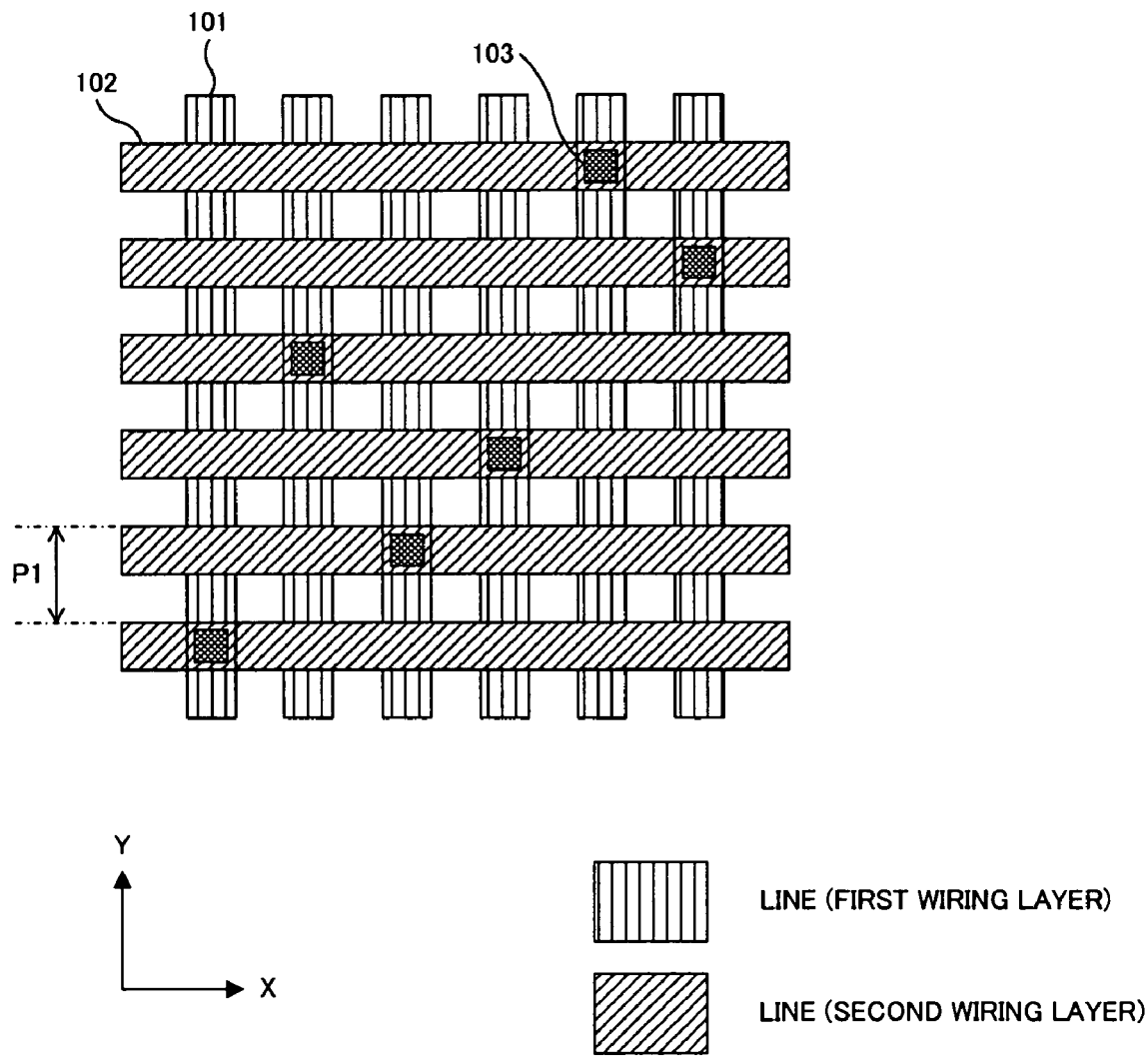
FIG. 7 is a diagram showing a conventional layout example in which two line groups formed in a matrix shape in two wiring layers are connected through contacts.
Figure 8:
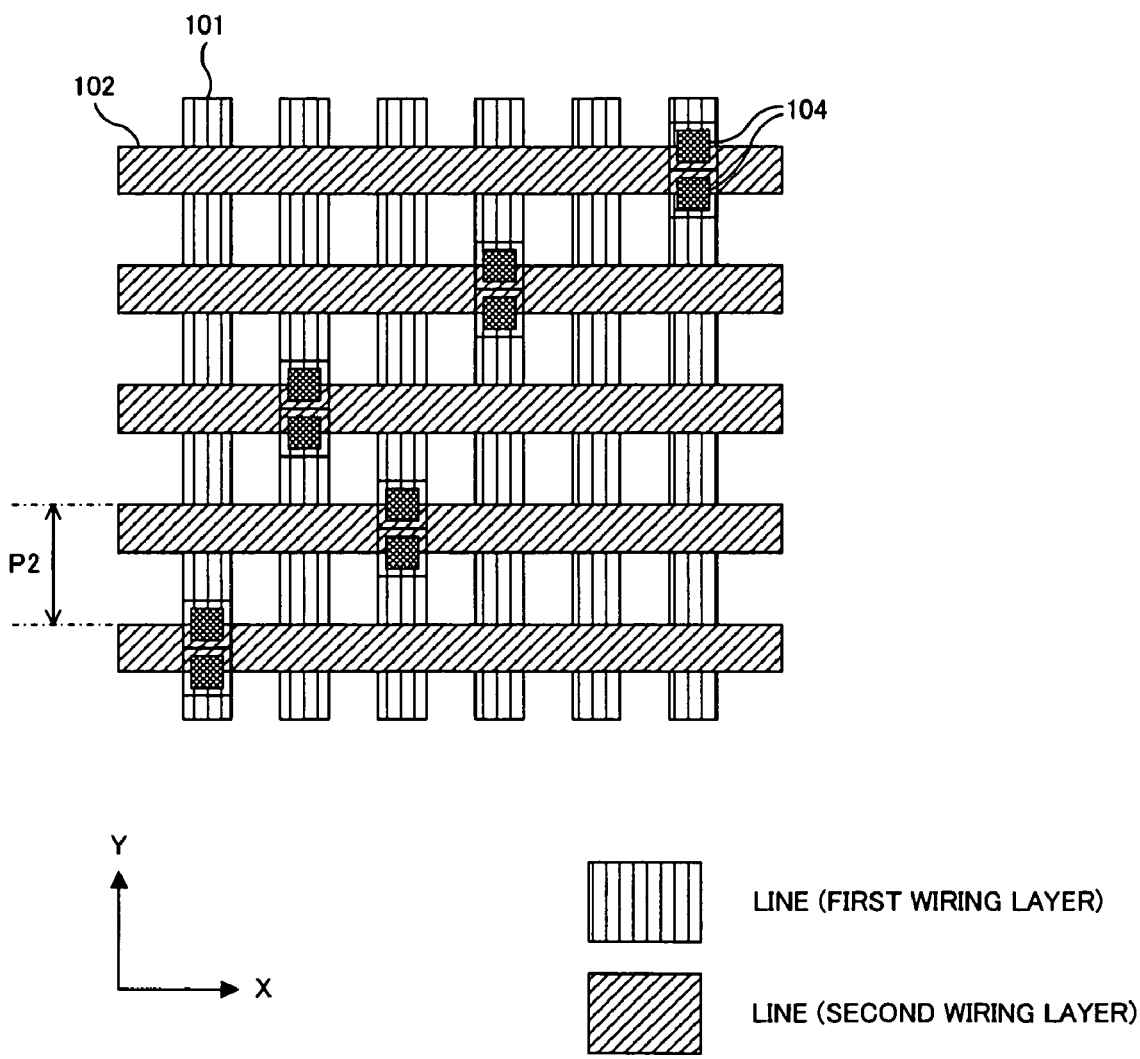
FIG. 8 is a diagram showing a conventional layout example achieving the same function as that of FIG. 7 by using a different layout.

Further, since two contacts 23 are formed at the connecting point of the line 20 of the first wiring layer and the line 21 of the second wiring layer, poor connection due to trouble in one of the contacts 23 can be avoided, thereby improving reliability of the entire chip as compared with a case of connection using one contact (see FIG. 7). When using the arrangement of FIG. 3, since the two contacts 23 are formed by utilizing areas for shifting from the line portion 21a to the line portion 21b by one track, the layout of FIG. 3 can be achieved while maintaining the defined track pitch without increasing the pitch of the lines as in the layout of FIG. 8.

Specifically, as shown in FIG. 3, five lines 21 transmitting the signals Sa, Sb, Sc, Sd and Se can be arranged in a space corresponding to six tracks, and therefore an increasing space in the Y direction merely corresponds to one track. In this case, even if the number of lines 21 in FIG. 3 increases, the increasing space always corresponds to one track, and thus a substantial increase in space is slight in a case where a larger number of lines are formed. By employing the layout of FIG. 3 in this manner, highly reliable wiring connection can be achieved without sacrificing space efficiency.

[Modification of the Layout of the Present Invention]

Figure 6:
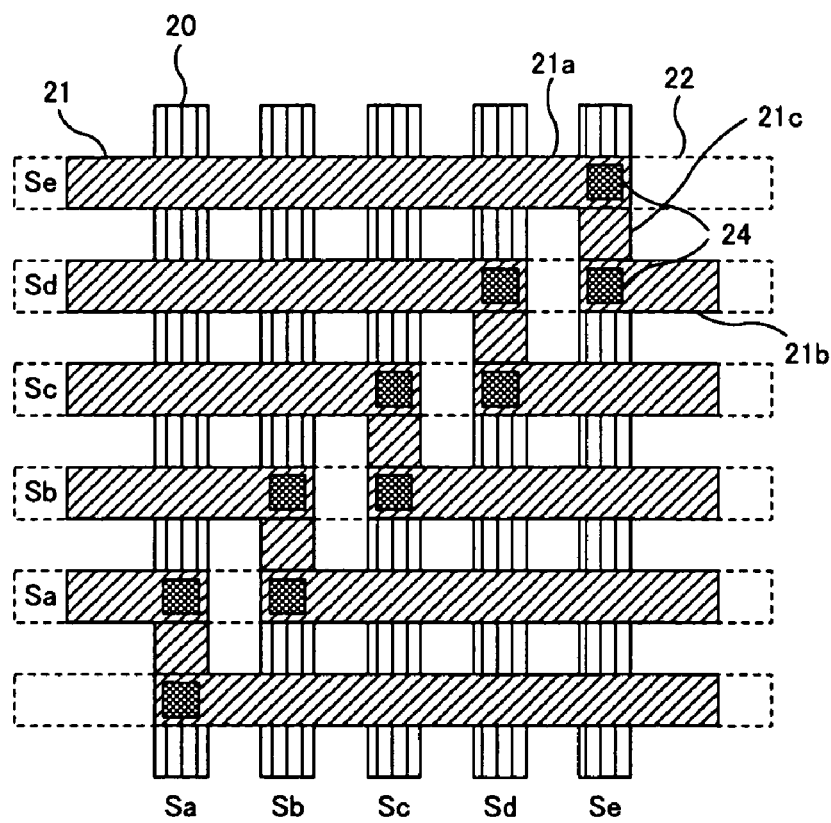
FIG. 6 a plane view showing a modification of the layouts of the embodiment.
Figure 6:
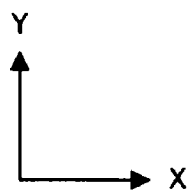
Figure 6:
Figure 6:
Figure 6:

FIG. 6 is a plane view showing a modification of the layouts of the embodiment. In the modification of FIG. 6, the plurality of lines 20 of the first wiring layer, the line portions 21a and 21b of the plurality of lines 21 of the second wiring layer, and the plurality of lines 22 of the third wiring layer are the same as those in the layout of FIG. 3. Meanwhile, two contacts 24 formed at each line portion 21c in the modification of FIG. 6 are different from FIG. 3. That is, one of the two contacts 24 is formed at a position overlapping the right end of the left line portion 21a and the other thereof is formed at a position overlapping the left end of the right line portion 21b. The two contacts 23 in FIG. 3 are adjacent to each other while the two contacts 24 in FIG. 6 are arranged with a gap corresponding to one pitch. In this case, ten contacts 24 in entire FIG. 6 are located at intersections of the lines 20 of the first wiring layer and the lines 21 of the second wiring layer. In this manner, a large number of contacts 24 arranged with a relatively large constant pitch have advantage of being easily manufactured.

In the foregoing, the embodiments have been described based on FIGS. 1 to 6, however the layout of FIG. 3 or 6 can be widely employed in a circuit portion in which a plurality of lines such as an address bus or a data bus are bundled and arranged, without being limited to the array portion 10 of the DRAM. Further, the case in which the present invention is applied to the DRAM as the semiconductor device has been described in the embodiments, however the present invention can be widely applied to a semiconductor memory device other than a DRAM or to a general semiconductor device having a layout pattern of signal lines. Further, the case in which the two contacts 23 (24) are formed at the connection portion 21c of the line 21 has been described in the layout of FIG. 3 or 6. However, if three or more contacts 23 (24) are formed at a space corresponding to one track, the number of contacts 23 (24) at the connection portion 21c is not limited to two.

It is apparent that the present invention is not limited to the above embodiments, but may be modified and changed without departing from the scope and spirit of the invention.

What is claimed is:

1. A semiconductor device comprising a multi-level wiring structure including a lower-level wiring layer and an upper-level wiring layer, the multilevel wiring structure comprising:
   a first wiring provided as one of the lower-level and upper-level wiring layers, the first wiring running in a first direction;
   a second wiring provided as the other of the lower-level and upper-level wiring layers, the second wiring running in a second direction crossing the first direction, bending in the first direction to overlap with a portion of the first wiring, and further bending in the second direction; and
   first and second contacts provided to connect first and second parts in the portion of the first wiring respectively to corresponding parts in a portion of the second wiring that overlaps with the portion of the first wiring.

2. The device as claimed in claim 1, wherein the second direction is substantially perpendicular to the first direction.

3. The device as claimed in claim 1, wherein the multilevel wiring structure further comprises;
   a third wiring provided as the one of the lower-level and upper-level wiring layers, the first wiring running in the first direction in substantially parallel to the first wiring,
   a fourth wiring provided as the other of the lower-level and upper-level wiring layers, the fourth wiring running in the second direction in substantially parallel to the second wiring, to pass through the first wiring, bending in the first direction to overlap with a portion of the third wiring, and further bending in the second direction, and
   third and fourth contacts provided to connect third and fourth parts in the portion of the third wiring respectively to corresponding parts in a portion of the fourth wiring that overlaps with the portion of the third wiring.

4. The device as claimed in claim 3, wherein the fourth wiring runs in the second direction substantially parallel to the second wiring with a first pitch, and a gap between the first and second contacts is less than the first pitch.

5. The device as claimed in claim 3, wherein the fourth wiring runs in the second direction substantially parallel to the second wiring with a first pitch, and a gap between the first and second contacts is substantially equal to the first pitch.

6. The device as claimed in claim 1, wherein the multilevel wiring structure further comprises an additional wiring layer formed above the upper-level wiring layer, a third wiring provided as the additional wiring layer, the third wiring runs straight in the second direction to overlap with a portion of the second wiring.

7. A device comprising
   an array portion including a word line that is elongated in a first direction, a bit line that is elongated in a second direction crossing the first direction, and a memory cell arranged on an intersection of the word line and the bit line;
   a first area arranged so as to be adjacent to the array portion in the second direction;
   a row decoder arranged in the first area;
   first and second wiring layers formed over the first area, the second wiring layer being formed above the first wiring layer; and
   a first signal passage connected between the row decoder and the word line, the first signal passage including a first line that is formed in the first wiring layer and is elongated in the second direction, a second line that is formed in the second wiring layer, and a plurality of first contacts formed between the first and the second lines, the second line further including first and second portions that are elongated in the first direction and a first connection portion that is elongated in the second direction, the first connection portion of the second line being coupled to the first portion of the second line at one end thereof and being coupled to the second portion of the second line at the other end thereof, the second line of the first signal passage being in contact with the first contacts of the first signal passage at the first connection portion thereof.

8. The device as claimed in claim 7, further comprising;
   a second area arranged so as to be adjacent to the array portion in the first direction,
   a column decoder arranged in the second area, and
   a second signal passage connected between the column decoder and the bit line, the second signal passage including a third line that is formed in the first wiring layer and is elongated in the second direction, a fourth line that is formed in the second wiring layer, and a plurality of second contacts formed between the third and the fourth lines, the fourth line further including third and fourth portions that are elongated in the first direction and a second connection portion that is elongated in the second direction, the second connection portion of the fourth line being coupled to the third portion of the fourth line at one end thereof and being coupled to the fourth portion of the fourth line at the other end thereof, the fourth line of the second signal passage being in contact with the second contacts of the second signal passage at the second connection portion thereof.

9. The device as claimed in claim 7, wherein the second direction is substantially perpendicular to the first direction.

* * * * *